US012710778B2

(12) United States Patent
Tamura

(10) Patent No.: US 12,710,778 B2
(45) Date of Patent: Aug. 18, 2026

(54) ADJUSTABLE VOLTAGE DIVIDER CIRCUIT AND METHOD

(71) Applicant: TAIWAN SEMICONDUCTOR MANUFACTURING COMPANY, LTD., Hsinchu (TW)

(72) Inventor: Motoki Tamura, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 213 days.

(21) Appl. No.: 18/403,650

(22) Filed: Jan. 3, 2024

(65) Prior Publication Data

US 2025/0076910 A1 Mar. 6, 2025

Related U.S. Application Data

(60) Provisional application No. 63/580,786, filed on Sep. 6, 2023.

(51) Int. Cl.
*G05F 1/575* (2006.01)
*G05F 1/565* (2006.01)
*H03K 17/082* (2006.01)

(52) U.S. Cl.
CPC .............. *G05F 1/575* (2013.01); *G05F 1/565* (2013.01); *H03K 17/0822* (2013.01)

(58) Field of Classification Search
CPC ................................ G05F 1/565; G05F 1/575
See application file for complete search history.

(56) References Cited

U.S. PATENT DOCUMENTS 10,666,134 B2 * 5/2020 Low ........................ H02M 1/32
2009/0072800 A1 * 3/2009 Ramadass .............. H02M 3/07 323/284
2014/0203958 A1 7/2014 Okuda et al.
2014/0268946 A1 * 9/2014 Liu ........................ H02M 3/07 363/60
2021/0034085 A1 * 2/2021 Mercer ................. H02M 3/158

FOREIGN PATENT DOCUMENTS

TW I286881 9/2007

* cited by examiner

*Primary Examiner* — Lakaisha Jackson
(74) *Attorney, Agent, or Firm* — Hauptman Ham, LLP

(57) ABSTRACT

A circuit includes a first capacitive device coupled between first and second nodes, a second capacitive device coupled between third and fourth nodes, a first switching device coupled between the first node and a voltage node, a second switching device coupled between the second node and a reference voltage node, a third switching device coupled between the third node and the voltage node, a fourth switching device coupled between the fourth node and the reference voltage node, fifth through eighth switching devices coupled between the respective first through fourth nodes and an output node, and first and second variable capacitance devices including first terminals coupled to either the respective first and third nodes or the respective second and fourth nodes.

20 Claims, 11 Drawing Sheets

400

ADJUSTABLE VOLTAGE DIVIDER CIRCUIT AND METHOD

PRIORITY CLAIM

The present application claims the priority of U.S. Provisional Application No. 63/580,786, filed Sep. 6, 2023, which is incorporated herein by reference in its entirety.

BACKGROUND

In many analog and digital circuit applications, multiple voltage levels are needed. To provide a given voltage level, some approaches rely on an independently sourced target voltage in addition to power supply and reference voltages. In other approaches, charge pump voltage dividers are used to provide a given voltage level based on power supply and reference voltage levels without relying on a received target voltage level.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
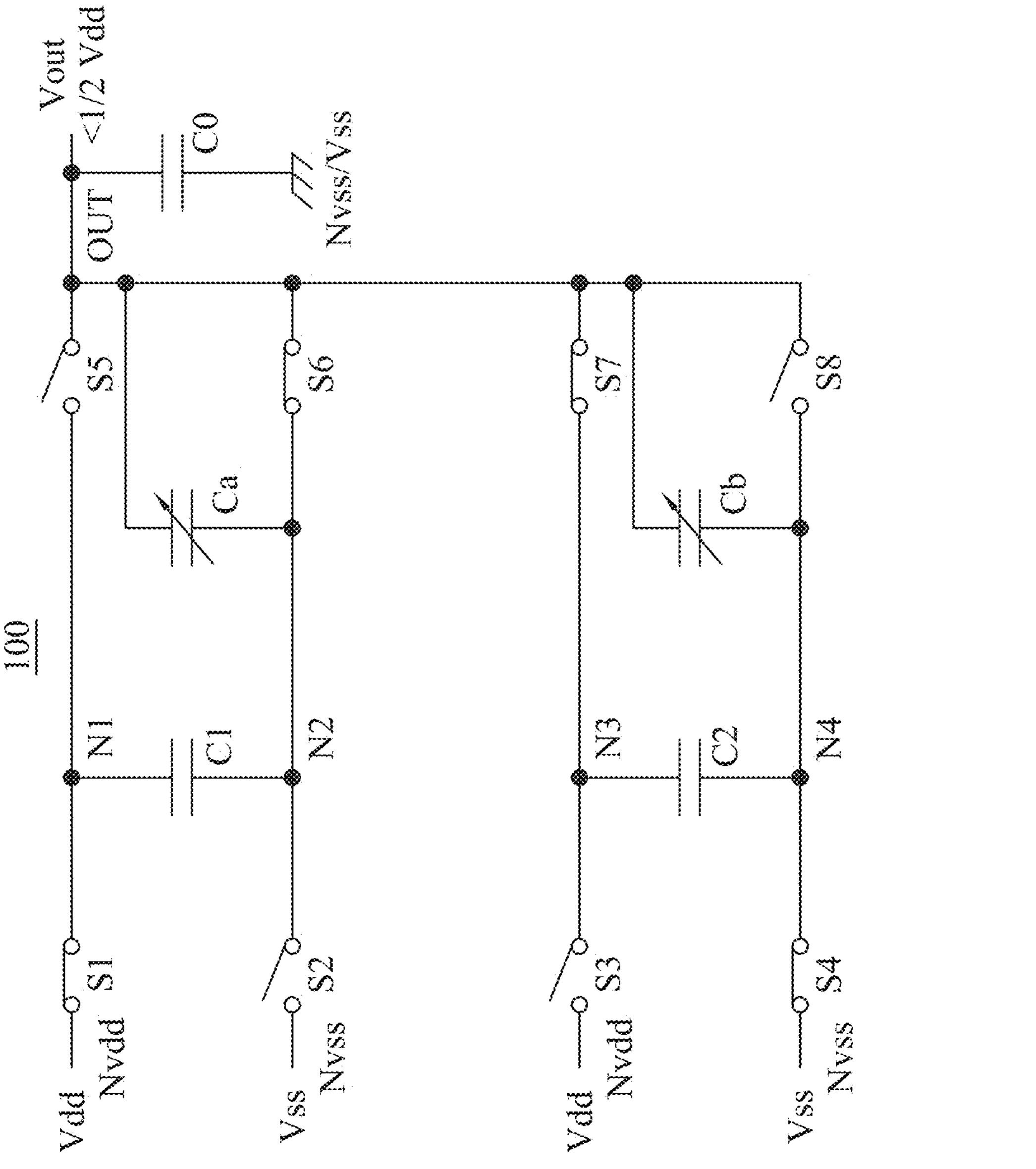
FIGS. 1A-1C are schematic diagrams of adjustable voltage divider circuits, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, an adjustable voltage divider circuit and method include capacitive devices coupled between first and second nodes and between third and fourth nodes, switching devices coupled between each of the first and third nodes and a voltage node, each of the second and fourth nodes and a reference node, and each of the first through fourth nodes and an output node, and variable capacitance devices including first terminals coupled to either the first and third nodes or to the second and fourth nodes and second terminals coupled to either the output node or the reference node. The switching devices are configured to alternatively switch an ordering of the capacitive devices, thereby generating an output voltage by dividing a voltage difference between the voltage and reference nodes.

By thereby including variable capacitance devices configured to share charges with the capacitive devices, the circuit is capable of generating the output voltage having adjustable values based on the voltage difference and values of the variable capacitance devices. Compared to other approaches, e.g., divider circuits that do not include variable capacitive devices or series regulator circuits, the circuit is thereby capable of generating adjustable output voltage values without relying on an independently sourced target voltage or discharge circuit.

Each of FIGS. 1A-1C and 2A-2C is a schematic diagram of some or all of an adjustable voltage divider circuit 100, 100S, 200, or 200S, in accordance with some embodiments. Adjustable voltage divider circuits 100, 100S, 200, and 200S are also referred to as circuits 100, 100S, 200, and 200S, voltage dividers 100, 100S, 200, and 200S, or charge pump voltage dividers 100, 100S, 200, and 200S in some embodiments.

In some embodiments, one or more of circuits 100, 100S, 200, or 200S, is some or all of an integrated circuit (IC). In some embodiments, one or more of circuits 100, 100S, 200, or 200S, is included in another IC circuit, e.g., a digital circuit, an analog circuit, and/or a memory circuit.

Each of circuits 100, 100S, 200, and 200S includes a voltage node Nvdd and a reference voltage node Nvss. Voltage node Nvdd, also referred to as power supply voltage node Nvdd in some embodiments, includes one or more conductive paths configured to distribute a voltage Vdd, also referred to as a power supply voltage Vdd in some embodiments. In some embodiments, voltage Vdd is a voltage of a power domain including circuit 100, 100S, 200, and/or 200S, and has a voltage level of the power domain.

Reference voltage node Nvss, also referred to as reference node Nvss or ground node Nvss in some embodiments, includes one or more conductive paths configured to distribute a reference voltage Vss, also referred to as ground Vss or ground voltage Vss in some embodiments. In some embodiments, reference voltage Vss is a reference voltage of a power domain including circuit 100, 100S, 200, and/or 200S, and has a reference voltage level of the power domain.

As depicted in FIGS. 1A-1C and 2A-2C, each of circuits 100, 100S, 200, and 200S also includes nodes N1-N4, an output node OUT, switching devices S1-S8, capacitive devices C0-C2, and variable capacitance devices Ca and Cb.

FIGS. 1A-1C and 2A-2C are simplified for the purpose of illustration. In some embodiments, one or more of circuits 100, 100S, 200, or 200S includes features in addition to those depicted in FIGS. 1A-1C and 2A-2C, e.g., one or more control and/or clock circuits configured to generate one or more control and/or clock signals, and/or one or more control or clock signal paths coupled to control terminals of switches S1-S8 and/or variable capacitance devices Ca and Cb and configured to propagate the one or more control and/or clock signals.

Switching device S1 is coupled between node N1 and voltage node Nvdd, switching device S2 is coupled between node N2 and reference voltage node Nvss, switching device S3 is coupled between node N3 and voltage node Nvdd, switching device S4 is coupled between node N4 and reference voltage node Nvss, and switching devices S5-S8 are coupled between respective nodes N1-N4 and output node OUT.

Capacitive device C0 is coupled between output node OUT and reference voltage node Nvss, capacitive device C1 is coupled between nodes N1 and N2, and capacitive device C2 is coupled between nodes N3 and N4.

Figure 1B:
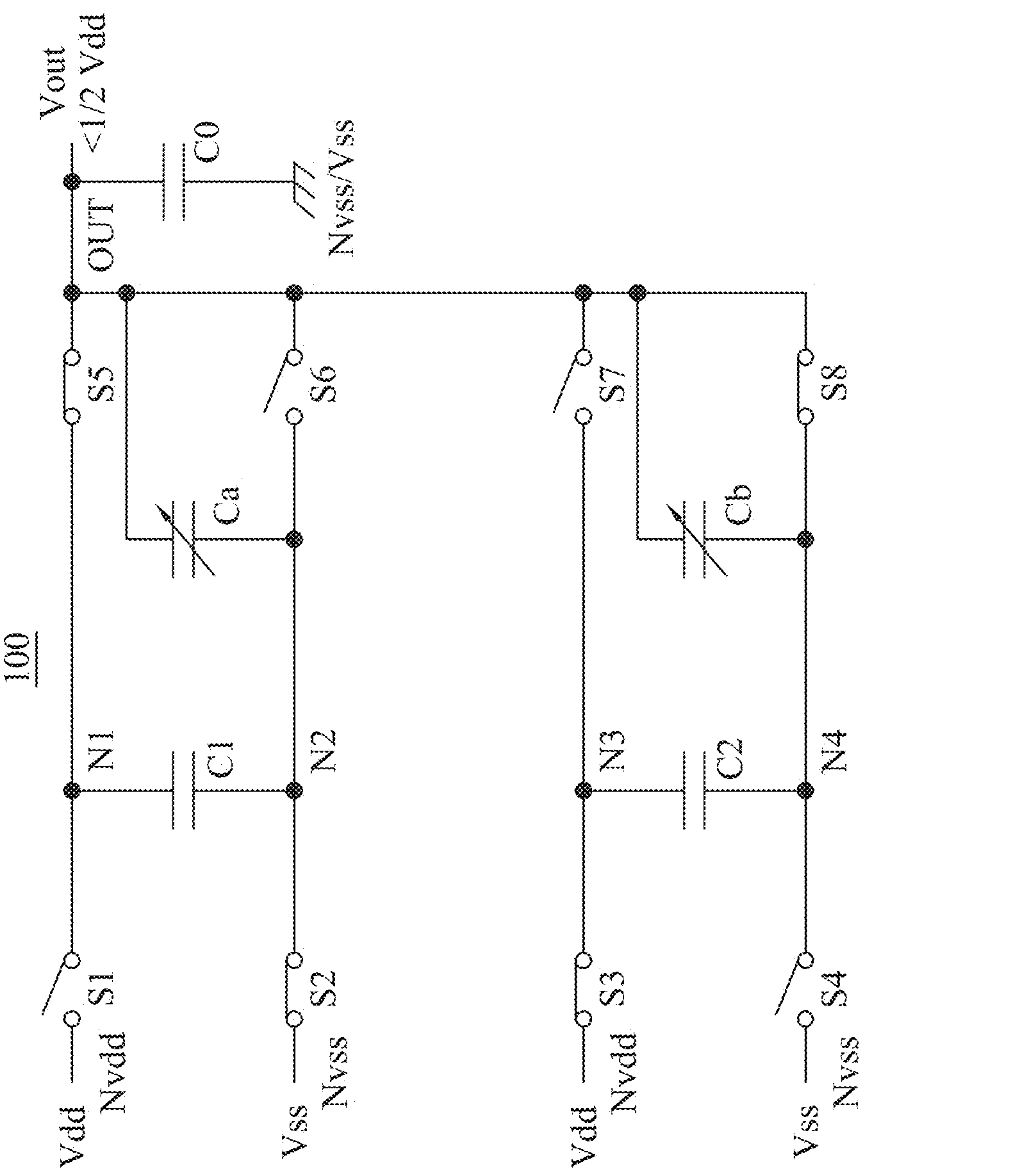
Figure 1C:
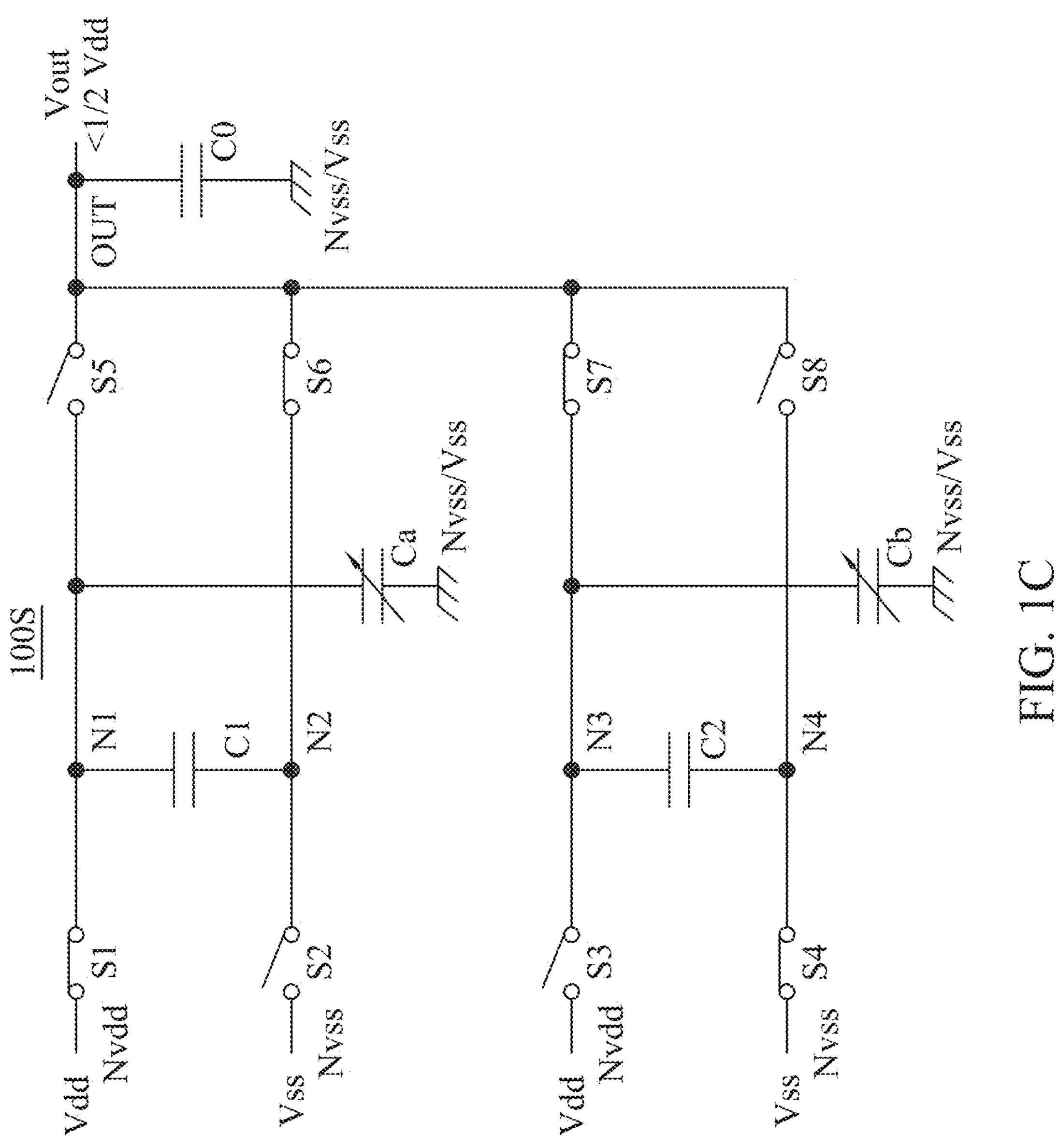

As depicted in FIGS. 1A and 1B, circuit 100 includes variable capacitance devices Ca and Cb coupled between respective nodes N2 and N4 and output node OUT. As depicted in FIG. 1C, circuit 100S includes a shunt arrangement of variable capacitance devices Ca and Cb coupled between respective nodes N1 and N3 and reference voltage node Nvss.

Figure 2A:
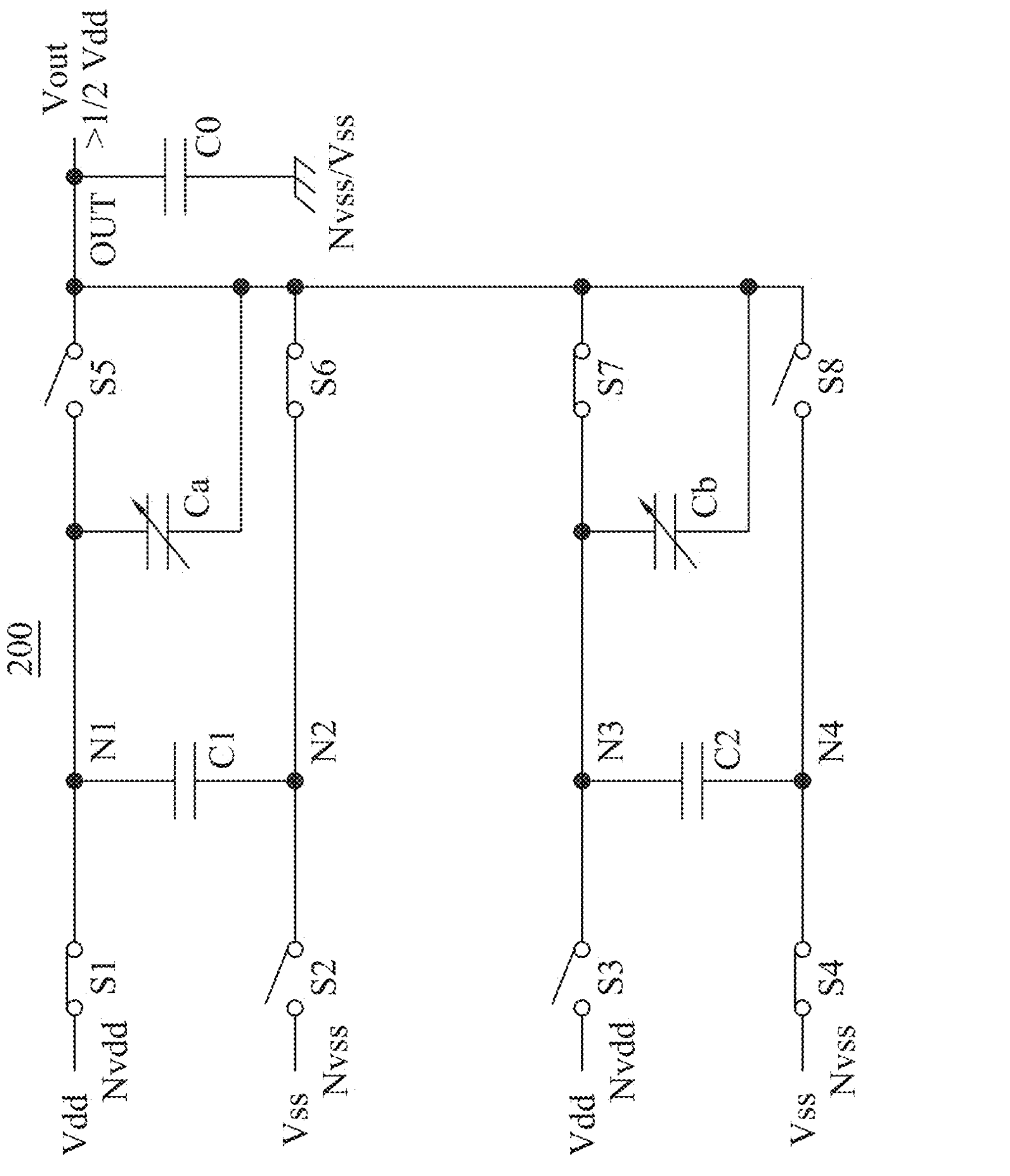
FIGS. 2A-2C are schematic diagrams of adjustable voltage divider circuits, in accordance with some embodiments.
Figure 2B:
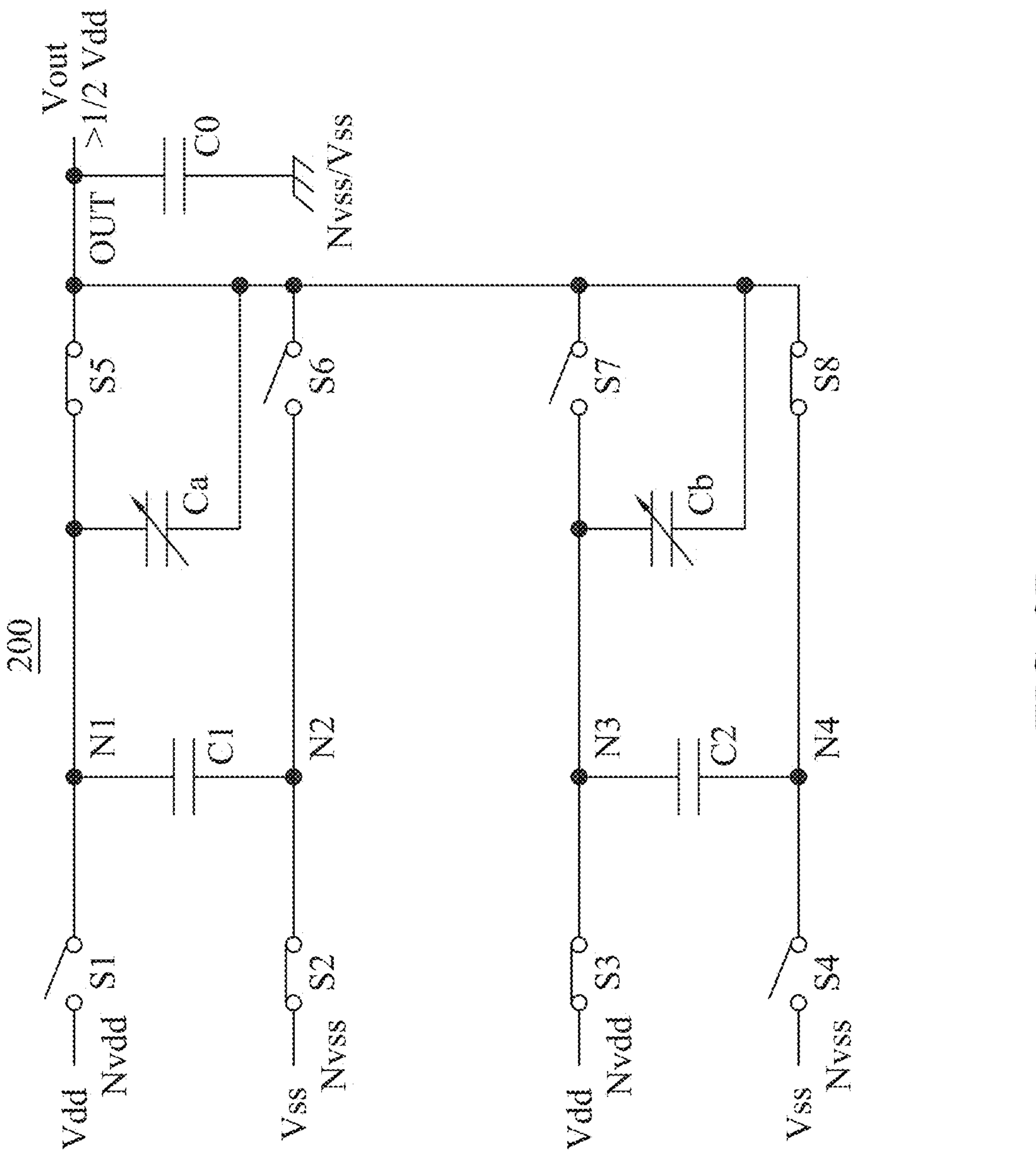
Figure 2C:
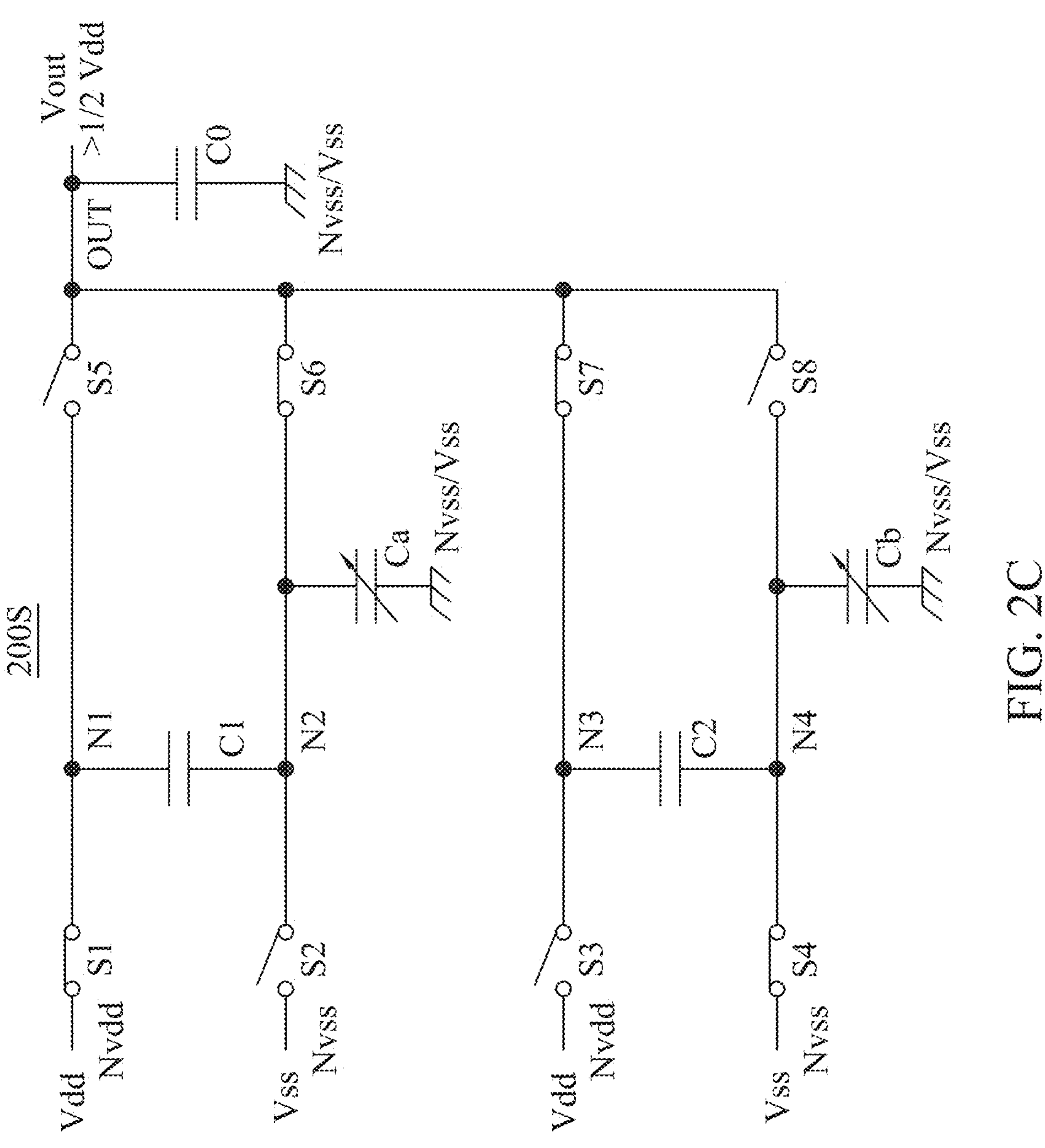

As depicted in FIGS. 2A and 2B, circuit 200 includes variable capacitance devices Ca and Cb coupled between respective nodes N1 and N3 and output node OUT. As depicted in FIG. 2C, circuit 200S includes a shunt arrangement of variable capacitance devices Ca and Cb coupled between respective nodes N2 and N4 and reference voltage node Nvss.

Two or more circuit elements are considered to be coupled based on a direct electrical connection or an electrical connection that includes one or more additional circuit elements and is thereby capable of being controlled, e.g., made resistive or open by one or more transistors or other switching devices.

A switching device, e.g., a switching device S1-S8, is an electronic or electromechanical device, e.g., an IC device, configured to provide either a resistive path or an open path between two path terminals (not labeled) responsive to one or more signals received at one or more control terminals (not shown). In some embodiments, a switching device includes an n-type or p-type transistor, a transmission gate, or the like.

A capacitive device, e.g., capacitive device C0-C2, is an electronic device, e.g., an IC device, configured to provide a predetermined capacitance level between two terminals (not labeled). In some embodiments, a capacitive device includes a metal-insulator-metal (MIM) capacitor, an n-type or p-type transistor configured as a capacitor, or the like.

A variable capacitance device, e.g., variable capacitance device Ca or Cb, is an electronic or electromechanical device, e.g., an IC device, configured to provide multiple predetermined capacitance levels between two terminals (not labeled) responsive to one or more signals received at one or more control terminals (not shown). In some embodiments, a variable capacitance device includes a single configurable capacitive device or an arrangement of multiple capacitive devices and switching devices. In some embodiments, a variable capacitance device includes a variable capacitance device 400 discussed below with respect to FIG. 4.

Each of circuits 100, 100S, 200, and 200S is configured to, in operation, control switching devices S1-S8 whereby switching devices S1, S4, S6, and S7 are collectively switched on and off alternatively with switching devices S2, S3, S5, and S8.

Each of FIGS. 1A, 1C, 2A, and 2C depicts a first state of the corresponding circuit 100, 100S, 200, or 200S in which each of switching devices S1, S4, S6, and S7 is closed and each of switching devices S2, S3, S5, and S8 is open. Each of FIGS. 1B and 2B depicts a second state of the corresponding circuit 100 or 200 in which each of switching devices S1, S4, S6, and S7 is open and each of switching devices S2, S3, S5, and S8 is closed.

In the first state, capacitive device C1 is thereby configured to be coupled between voltage node Nvdd and output node OUT through switching devices S1 and S6, and capacitive device C2 is thereby configured to be coupled between output node OUT and reference voltage node Nvss through switching devices S7 and S4. In operation, the first state thereby corresponds to a first voltage divider arrangement in which capacitive devices C1 and C2 are coupled in series in a first order between voltage node Nvdd and reference voltage node Nvss, with output node OUT coupled to corresponding first terminals of capacitive devices C1 and C2.

In the second state, capacitive device C2 is thereby configured to be coupled between voltage node Nvdd and output node OUT through switching devices S3 and S8, and capacitive device C1 is thereby configured to be coupled between output node OUT and reference voltage node Nvss through switching devices S5 and S2. In operation, the second state thereby corresponds to a second voltage divider arrangement in which capacitive devices C1 and C2 are coupled in series in a second order between voltage node Nvdd and reference voltage node Nvss, with output node OUT coupled to corresponding second terminals of capacitive devices C1 and C2.

In operation, capacitive device C0 coupled between output node OUT and reference voltage node Nvss acts to maintain a voltage level of an output voltage Vout on output node OUT by storing a charge on output node OUT as the corresponding circuit 100, 100S, 200, or 200S alternates between the first and second states.

In some embodiments, to be capable of maintaining the voltage level of output voltage Vout, capacitive device C0 has a capacitance value at least one order of magnitude greater than one or more capacitance values of capacitive devices C1 and C2.

Each of circuits 100, 100S, 200, and 200S thereby includes switching devices S1-S8 configured to, in operation, alternatively switch an ordering of capacitive devices C1 and C2, whereby output voltage Vout is generated by dividing a voltage difference between voltage Vdd and reference voltage Vss.

In the absence of variable capacitance devices Ca and Cb, each of circuits 100, 100S, 200, and 200S is thereby configured to generate output voltage Vout having a default fractional value of the voltage difference based on capacitance values of capacitive devices C1 and C2 and a duty cycle of the first and second states.

In some embodiments, one or more of circuits 100, 100S, 200, or 200S is configured to generate output voltage Vout having the default fractional value equal to ½ Vdd (with respect to voltage Vss).

In some embodiments, one or more of circuits 100, 100S, 200, or 200S includes capacitive devices C1 and C2 configured to have a same capacitance value or unequal capacitance values.

In some embodiments, one or more of circuits 100, 100S, 200, or 200S is configured to alternate between the first and second states based on a duty cycle of 50 percent (%), e.g., based on one or more clock signals having a duty cycle of 50%, or based on a duty cycle of greater than 50% with respect to one of the first or second states.

As depicted in FIG. 1A, in the first state of circuit 100, switching device S6 being closed causes node N2 to be coupled to output node OUT, thereby coupling the terminals of variable capacitance device Ca to each other, and the combination of switching device S7 being closed and switching device S8 being open causes variable capacitance device Cb to be coupled in parallel with capacitive device C2 between output node OUT and reference voltage node Nvss.

As depicted in FIG. 1B, in the second state of circuit 100, the combination of switching device S5 being closed and switching device S6 being open causes variable capacitance device Ca to be coupled in parallel with capacitive device C1 between output node OUT and reference voltage node Nvss, and switching device S8 being closed causes node N4 to be coupled to output node OUT, thereby coupling the terminals of variable capacitance device Cb to each other.

Circuit 100 is thereby configured to, in operation, cause each of variable capacitance devices Ca and Cb to be selectively coupled in parallel with the corresponding capacitive device C1 or C2 during the corresponding first or second state in which the corresponding capacitive device C1 or C2 is coupled between output node OUT and reference voltage node Nvss, and otherwise be rendered insignificant based on the terminals being coupled together. A total capacitance between output node OUT and reference voltage node Nvss is thereby selectively increased compared to a total capacitance between output node OUT and voltage node Nvdd such that a value of output voltage Vout is reduced compared to the default fractional value, e.g., ½ Vdd.

An amount of the reduction of the value of output voltage Vout is a function of the capacitance values of each of capacitive devices C1 and C2 and variable capacitance devices Ca and Cb. In some embodiments, each of variable capacitance devices Ca and Cb has capacitance values having a same order of magnitude as one or more capacitance values of capacitive devices C1 and C2. In some embodiments, variable capacitance devices Ca and Cb have same capacitance values or unequal capacitance values.

In an embodiment in which each of capacitive devices C1 and C2 has a same capacitance value C12 and each of variable capacitance devices Ca and Cb has a same capacitance value Cab, balancing of electrostatic energy in the first and second states of circuit 100 is represented by:

$$1/2\ C12*(Vdd-Vout)^2 = 1/2(C12+\mathrm{Cab})*Vout^2 \quad (1)$$

By representing the fractional value of output voltage Vout relative to voltage Vdd as x (0<x<0.5), Vout=x*Vdd, and an approximation of Cab relative to C12 is thereby given by:

$$\mathrm{Cab} = \left[(1-2x)/x^2\right]*C12 \quad (2)$$

In this non-limiting example, output voltage Vout having a value equal to 0.45*Vdd (x=0.45) thereby corresponds to Cab=0.494*C12, and output voltage Vout having a value equal to 0.40*Vdd (x=0.40) thereby corresponds to Cab=1.25*C12.

As depicted in FIG. 1C, in the first state of circuit 100S, switching device S1 being closed causes node N1 to be coupled to voltage node Nvdd, thereby causing variable capacitance device Ca to be coupled in parallel with the first series arrangement of capacitive devices C1 and C2 between voltage node Nvdd and reference voltage node Nvss, and switching device S7 being closed causes node N3 to be coupled to output node OUT and variable capacitance device Cb to be coupled in parallel with capacitive device C2 between output node OUT and reference voltage node Nvss.

Similarly, in the second state of circuit 100S (not shown), switching device S3 being closed causes node N3 to be coupled to voltage node Nvdd, thereby causing variable capacitance device Cb to be coupled in parallel with the second series arrangement of capacitive devices C1 and C2 between voltage node Nvdd and reference voltage node Nvss, and switching device S5 being closed causes node N1 to be coupled to output node OUT and variable capacitance device Ca to be coupled in parallel with capacitive device C1 between output node OUT and reference voltage node Nvss.

Circuit 100S is thereby configured to, in operation, cause each of variable capacitance devices Ca and Cb to be selectively coupled in parallel with the corresponding capacitive device C1 or C2 during the corresponding first or second state in which the corresponding capacitive device C1 or C2 is coupled between output node OUT and reference voltage node Nvss, and otherwise be coupled between the corresponding series arrangement of capacitive devices C1 and C2. A total capacitance between output node OUT and reference voltage node Nvss is thereby selectively increased compared to a total capacitance between output node OUT and voltage node Nvdd such that a value of output voltage Vout is reduced compared to the default fractional value, e.g., ½ Vdd.

Compared to circuit 100, circuit 100S is less efficient based on variable capacitance devices Ca and Cb being coupled in parallel with series arrangements of capacitive devices C1 and C2 instead of being rendered insignificant based on the terminals being coupled together.

In each of circuits 100 and 100S, an amount of the reduction in the value of Vout compared to the default fractional value is adjustable based on the capacitance value or values of variable capacitance devices Ca and Cb. In some embodiments, a circuit 100 or 100S includes a measurement, control, or other circuit (not shown) configured to monitor, or receive an indication of, the value of output voltage Vout, and based on the measured value, adjust the capacitance value or values of variable capacitance devices Ca and/or Cb, thereby adjusting the amount of the reduction in the value of output voltage Vout compared to the default fractional value.

Circuits 100 and 100S configured to reduce a value of output voltage Vout compared to a default fractional value by selectively and adjustably increasing a total capacitance between output node OUT and reference voltage node Nvss compared to a total capacitance between output node OUT and voltage node Nvdd are non-limiting examples. Other configurations in which a total capacitance between output node OUT and reference voltage node Nvss is selectively and adjustably increased compared to a total capacitance between output node OUT and voltage node Nvdd are within the scope of the present disclosure.

Figure 1D:
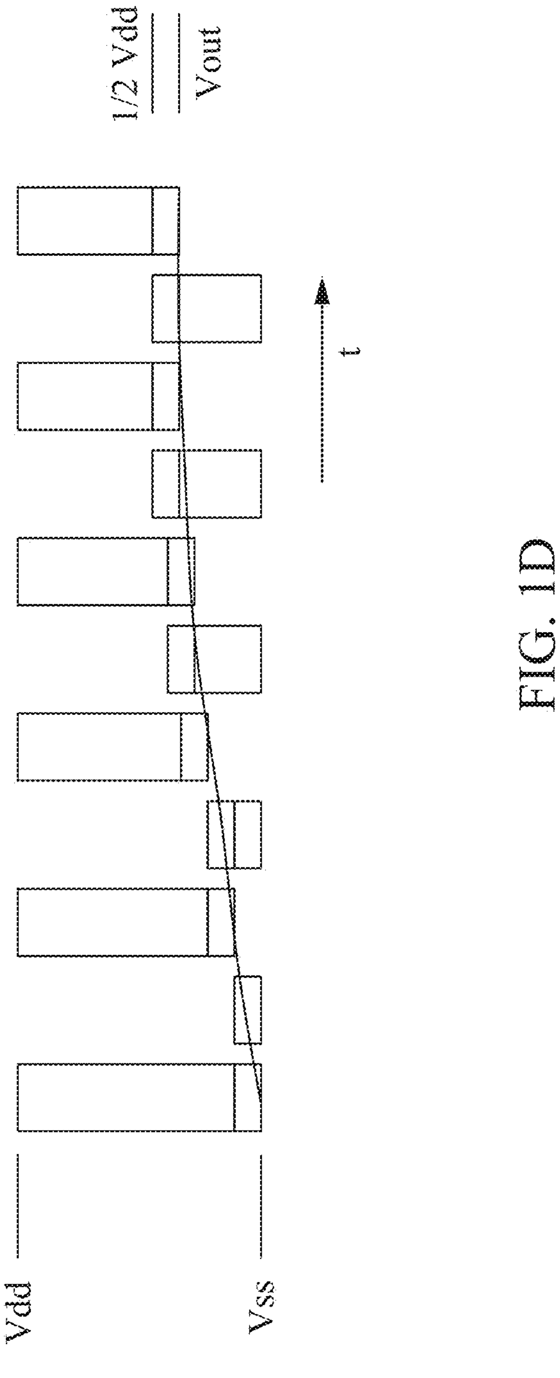
FIG. 1D is a diagram of adjustable voltage divider circuit operating parameters, in accordance with some embodiments.

FIG. 1D depicts operating parameters of circuits 100 and 100S, in accordance with some embodiments. FIG. 1D includes voltage Vdd, reference voltage Vss, and output voltage Vout plotted over time t.

As depicted in FIG. 1D, output voltage Vout increases from an initial value equal to reference voltage Vss and increases to a steady state value as capacitance device C0 charges in response to the alternating first and second states over time t.

In the non-limiting example depicted in FIG. 1D, the alternating first and second states have a duty cycle of 50% and output voltage Vout has the steady state value less than the default fractional value equal to ½ Vdd.

As depicted in FIG. 2A, in the first state of circuit 200, the combination of switching device S6 being closed and switching device S5 being open causes variable capacitance device Ca to be coupled in parallel with capacitive device C1 between voltage node Nvdd and output node OUT, and switching device S7 being closed causes node N3 to be coupled to output node OUT, thereby coupling the terminals of variable capacitance device Cb to each other.

As depicted in FIG. 2B, in the second state of circuit 200, switching device S5 being closed causes node N1 to be coupled to output node OUT, thereby coupling the terminals of variable capacitance device Ca to each other, and the combination of switching device S8 being closed and switching device S7 being open causes variable capacitance device Cb to be coupled in parallel with capacitive device C2 between voltage node Nvdd and output node OUT.

Circuit 200 is thereby configured to, in operation, cause each of variable capacitance devices Ca and Cb to be selectively coupled in parallel with the corresponding capacitive device C1 or C2 during the corresponding first or second state in which the corresponding capacitive device C1 or C2 is coupled between voltage node Nvdd and output node OUT, and otherwise be rendered insignificant based on the terminals being coupled together. A total capacitance between voltage node Nvdd and output node OUT is thereby selectively increased compared to a total capacitance between output node OUT and reference voltage node Nvss such that a value of output voltage Vout is increased compared to the default fractional value, e.g., ½ Vdd.

An amount of the increase of the value of output voltage Vout is a function of the capacitance values of each of capacitive devices C1 and C2 and variable capacitance devices Ca and Cb. In some embodiments, each of variable capacitance devices Ca and Cb has capacitance values having a same order of magnitude as one or more capacitance values of capacitive devices C1 and C2. In some embodiments, variable capacitance devices Ca and Cb have same capacitance values or unequal capacitance values.

In an embodiment in which each of capacitive devices C1 and C2 has a same capacitance value C12 and each of variable capacitance devices Ca and Cb has a same capacitance value Cab, balancing of electrostatic energy in the first and second states of circuit 200 is represented by:

$$1/2(C12+\text{Cab})*(Vdd-V\text{out})^2 = 1/2\ C12*V\text{out}^2 \tag{3}$$

By representing the fractional value of output voltage Vout relative to voltage Vdd as x (0.5<x<1.0), Vout=x*Vdd, and an approximation of Cab relative to C12 is thereby given by:

$$\text{Cab} = \left[(2x-1)/(1-x)^2\right]*C12 \tag{4}$$

In this non-limiting example, output voltage Vout having a value equal to 0.55*Vdd (x=0.55) thereby corresponds to Cab=0.494*C12, and output voltage Vout having a value equal to 0.60*Vdd (x=0.60) thereby corresponds to Cab=1.25*C12.

As depicted in FIG. 2C, in the first state of circuit 200S, switching device S6 being closed causes node N2 to be coupled to output node OUT, thereby causing variable capacitance device Ca to be coupled in parallel with capacitive device C2 between output node OUT and reference voltage node Nvss, and switching device S4 being closed causes node N4 to be coupled to reference voltage node Nvss, thereby coupling the terminals of variable capacitance device Cb to each other.

Similarly, in the second state of circuit 200S (not shown), switching device S2 being closed causes node N2 to be coupled to reference voltage node Nvss, thereby coupling the terminals of variable capacitance device Ca to each other, and switching device S8 being closed causes node N4 to be coupled to output node OUT, thereby causing variable capacitance device Cb to be coupled in parallel with capacitive device C1 between output node OUT and reference voltage node Nvss.

Circuit 200S is thereby configured to, in operation, cause each of variable capacitance devices Ca and Cb to be selectively coupled in series with the corresponding capacitive device C1 or C2 during the corresponding first or second state in which the corresponding capacitive device C1 or C2 is coupled between output node OUT and reference voltage node Nvss, and otherwise be rendered insignificant based on the terminals being coupled together. A total capacitance between voltage node Nvdd and reference voltage node Nvss is thereby selectively decreased such that a value of output voltage Vout is increased compared to the default fractional value, e.g., ½ Vdd.

Compared to circuit 200, circuit 200S is less efficient based on the terminals of variable capacitance devices Ca and Cb being coupled together at the reference voltage node instead of at the output voltage node.

In each of circuits 200 and 200S, an amount of the increase in the value of Vout compared to the default fractional value is adjustable based on the capacitance value or values of variable capacitance devices Ca and Cb. In some embodiments, a circuit 200 or 200S includes a measurement, control, or other circuit (not shown) configured to monitor, or receive an indication of, the value of output voltage Vout, and based on the measured value, adjust the capacitance value or values of variable capacitance devices Ca and/or Cb, thereby adjusting the amount of the increase in the value of output voltage Vout compared to the default fractional value.

Circuits 200 and 200S configured to increase a value of output voltage Vout compared to a default fractional value by selectively and adjustably increasing a total capacitance between voltage node Nvdd and output node OUT compared to a total capacitance between output node OUT and reference voltage node Nvss or decreasing a total capacitance between voltage node Nvdd and reference voltage node Nvss are non-limiting examples. Other configurations in which a total capacitance between voltage node Nvdd and output node OUT is selectively and adjustably increased compared to a total capacitance between output node OUT and reference voltage node Nvss or a total capacitance between voltage node Nvdd and reference voltage node Nvss is selectively and adjustably decreased are within the scope of the present disclosure.

Figure 2D:
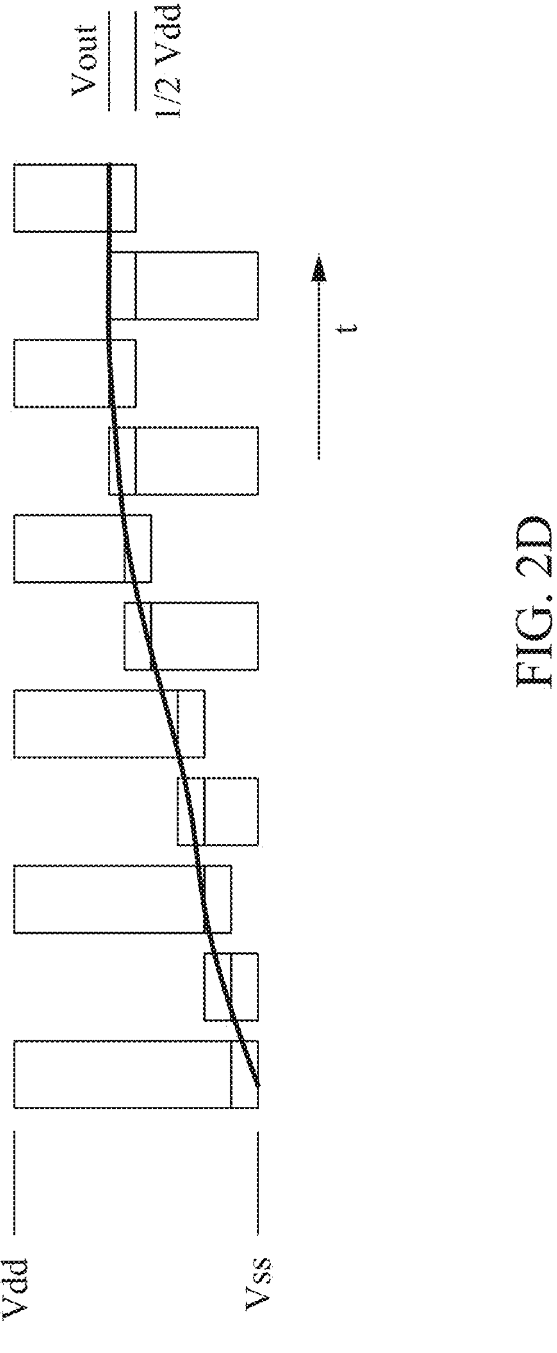
FIG. 2D is a diagram of adjustable voltage divider circuit operating parameters, in accordance with some embodiments.

FIG. 2D depicts operating parameters of circuits 200 and 200S, in accordance with some embodiments. FIG. 2D includes voltage Vdd, reference voltage Vss, and output voltage Vout plotted over time t.

As depicted in FIG. 2D, output voltage Vout increases from an initial value equal to reference voltage Vss and increases to a steady state value as capacitance device C1 charges in response to the alternating first and second states over time t.

In the non-limiting example depicted in FIG. 2D, the alternating first and second states have a duty cycle of 50% and output voltage Vout has the steady state value greater than the default fractional value equal to ½ Vdd.

Figure 3:
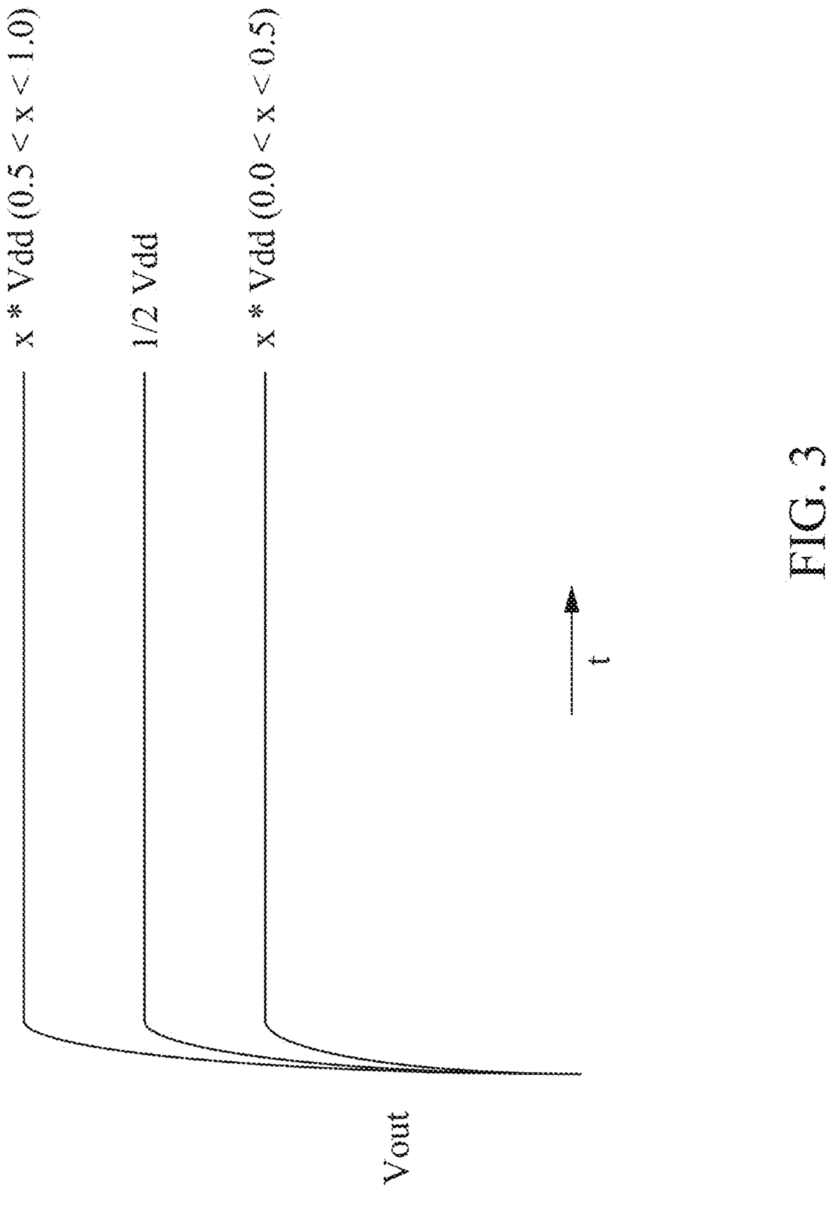
FIG. 3 is a diagram of adjustable voltage divider circuit operating parameters, in accordance with some embodiments.

FIG. 3 depicts operating parameters of circuits 100, 100S, 200, and 200S, in accordance with some embodiments. FIG. 3 includes output voltage Vout reaching a steady state value over time t for three cases.

In the non-limiting example depicted in FIG. 3, the first case corresponds to circuits 100 and 100S in which $0.0<x<0.5$ and the steady state value is less than the default fractional value of ½ Vdd, the second case illustrates the steady state value equal to the default fractional value of ½ Vdd, and the third case corresponds to circuits 200 and 200S in which $0.5<x<1.0$ and the steady state value is greater than the default fractional value of ½ Vdd.

By the configurations discussed above, each of circuits 100, 100S, 200, and 200S is an adjustable voltage divider circuit including capacitive devices C1 and C2 coupled between nodes N1 and N2 and between nodes N3 and N4, switching devices S1-S8 coupled between nodes N1 and N3 and voltage node Nvdd, between nodes N2 and N4 and reference voltage node Nvss, and between nodes N1-N4 and output node OUT, and variable capacitance devices Ca and Cb including first terminals coupled to nodes N1 and N3 or N2 and N4 and second terminals coupled to either output node OUT or reference voltage node Nvss.

Because switching devices S1-S8 are configured to alternatively switch the ordering of capacitive devices C1 and C2 including variable capacitance devices Ca and Cb configured as discussed above, each of circuits 100, 100S, 200, and 200S is capable of generating output voltage Vout having adjustable values based on voltage Vdd, reference voltage Vss, and values of variable capacitance devices Ca and Cb. Compared to other approaches, e.g., divider circuits that do not include variable capacitive devices or series regulator circuits, circuits 100, 100S, 200, and 200S are thereby capable of generating adjustable output voltage values without relying on an independently sourced target voltage or discharge circuit.

Figure 4:
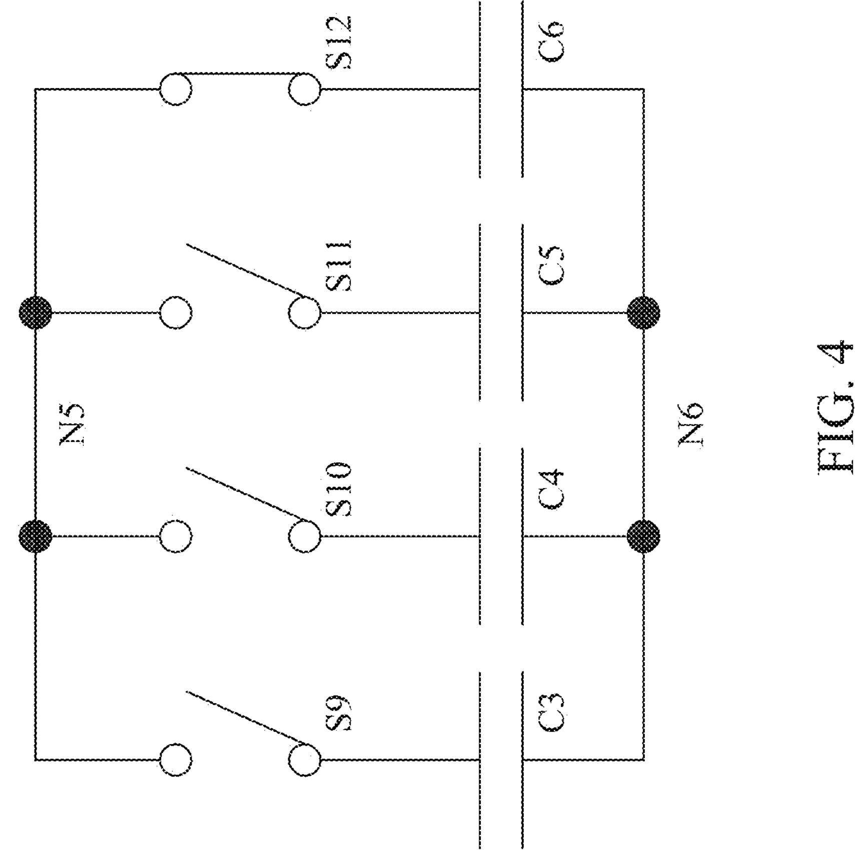
FIG. 4 is a schematic diagram of a variable capacitance device, in accordance with some embodiments.

FIG. 4 is a schematic diagram of variable capacitance device 400, in accordance with some embodiments. Variable capacitance device 400 is usable as one or both of variable capacitive devices Ca or Cb discussed above with respect to FIGS. 1A-3.

As depicted in FIG. 4, variable capacitance device 400 includes nodes N5 and N6, switching devices S9-S12, and capacitive devices C3-C6. Switching devices S9-S12 and respective capacitive devices C3-C6 are coupled in series between nodes N5 and N6, and each of switching devices S9-S12 includes a control terminal (not shown) configured to receive a control signal configured to, in operation, place the corresponding one of switching devices S9-S12 in the open or closed state.

In the embodiment depicted in FIG. 4, variable capacitance device 400 includes a total of four series arrangements of switching devices S9-S12 and capacitive devices C3-C6 coupled in parallel between nodes N5 and N6. In various embodiments, variable capacitance device 400 includes a total of fewer or greater than four series arrangements of switching devices and capacitive devices coupled in parallel between nodes N5 and N6.

In some embodiments, the capacitive devices, e.g., capacitive devices C3-C6, have a same or different capacitance values.

In operation, a total capacitance value of variable capacitance device 400 is the sum of the capacitance values of the instances of the capacitive devices, e.g., capacitive devices C3-C6, coupled in series with the instances of the switching devices, e.g., switching devices S9-S12, in the closed state.

A circuit 100, 100S, 200, or 200S including variable capacitance device 400 as one or both of variable capacitance device Ca or Cb is thereby capable of realizing the benefits discussed above with respect to circuits 100, 100S, 200, and 200S.

Figure 5:
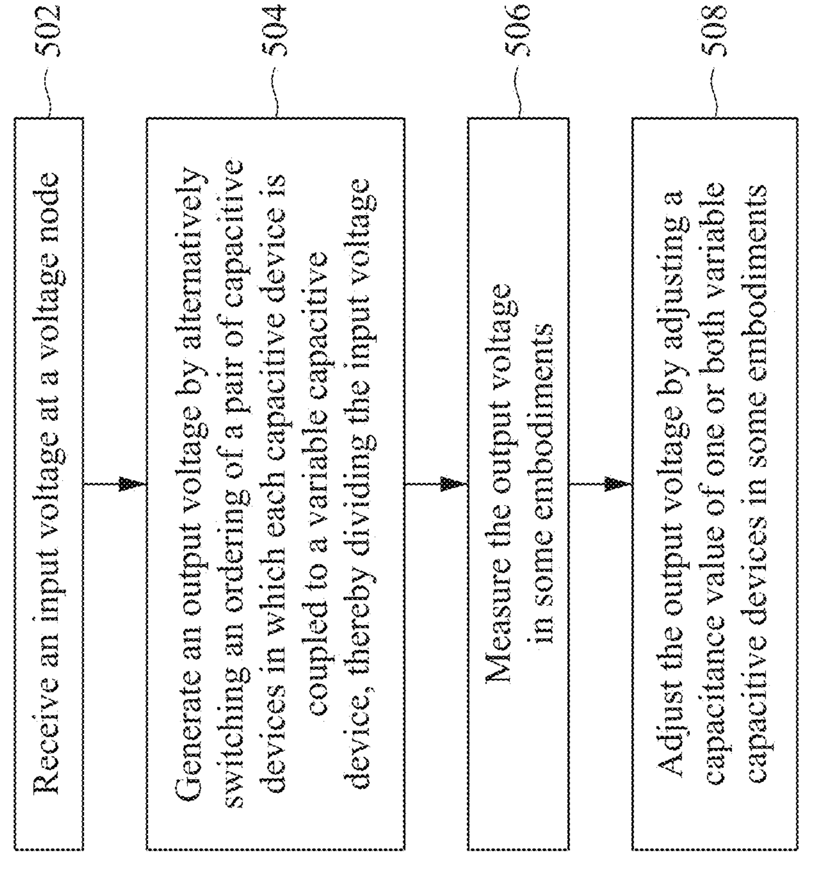
FIG. 5 is a flowchart of a method of operating an adjustable voltage divider circuit, in accordance with some embodiments.

FIG. 5 is a flowchart of method 500 of operating a circuit, in accordance with some embodiments. Method 500, also referred to as a method 500 of generating an output voltage in some embodiments, is usable with an adjustable voltage divider circuit, e.g., circuit 100, 100S, 200, or 200S discussed above with respect to FIGS. 1A-4.

The sequence in which the operations of method 500 are depicted in FIG. 5 is for illustration only; the operations of method 500 are capable of being executed in sequences that differ from that depicted in FIG. 5. In some embodiments, operations in addition to those depicted in FIG. 5 are performed before, between, during, and/or after the operations depicted in FIG. 5. In some embodiments, the operations of method 500 are a subset of a method of operating a digital or analog circuit, e.g., a memory circuit.

At operation 502, an input voltage is received at a voltage node. The voltage node is included in a circuit that also includes a first capacitive device coupled between first and second nodes, a second capacitive device coupled between third and fourth nodes, a first switching device coupled between the first node and the voltage node, a second switching device coupled between the second node and a reference voltage node, a third switching device coupled between the third node and the voltage node, a fourth switching device coupled between the fourth node and the reference voltage node, fifth through eighth switching devices coupled between the respective first through fourth nodes and an output node, and first and second variable capacitance devices including first terminals coupled to either the respective first and third nodes or the respective second and fourth nodes.

In some embodiments, receiving the input voltage at the voltage node includes receiving voltage Vdd at voltage node Nvdd and reference voltage Vss at reference voltage node Nvss as discussed above with respect to FIGS. 1A-4.

At operation 504, an output voltage is generated by alternatively switching an ordering of a pair of capacitive devices in which each capacitive device is coupled to a variable capacitive device, thereby dividing the input voltage. In some embodiments, generating the output voltage includes generating output voltage Vout by alternatively switching an ordering of capacitive devices C1 and C2 coupled to corresponding variable capacitive device Ca or Cb, thereby dividing voltage Vdd with respect to reference voltage Vss, as discussed above with respect to FIGS. 1A-4.

In some embodiments, alternatively switching the ordering of a pair of capacitive devices includes alternatively switching the first, fourth, sixth, and seventh switching devices with the second, third, fifth, and eighth switching devices.

In some embodiments, alternatively switching the first, fourth, sixth, and seventh switching devices with the second, third, fifth, and eighth switching devices includes alternatively coupling the output node to the reference node through a first parallel arrangement of the first capacitive device and the first variable capacitance device or a second parallel arrangement of the second capacitive device and the second variable capacitance device, e.g., as discussed above with respect to circuit 100 and FIGS. 1A-1D, 3, and 4.

In some embodiments, alternatively switching the first, fourth, sixth, and seventh switching devices with the second, third, fifth, and eighth switching devices includes alternatively coupling the output node to the voltage node through a first parallel arrangement of the first capacitive device and the first variable capacitance device or a second parallel arrangement of the second capacitive device and the second variable capacitance device, e.g., as discussed above with respect to circuit 200 and FIGS. 2A-4.

In some embodiments, generating the output voltage includes setting one or more values of the variable capacitance devices, e.g., as discussed above with respect to variable capacitance devices Ca, Cb, and 400 and FIGS. 1A-4.

At operation 506, in some embodiments, the output voltage is measured. In some embodiments, measuring the output voltage includes measuring output voltage Vout discussed above with respect to FIGS. 1A-4.

At operation 508, in some embodiments, the output voltage is adjusted by adjusting a capacitance value of one or both variable capacitive devices. In some embodiments, adjusting the output voltage is in response to a value of the output voltage measured in operation 506.

In some embodiments, adjusting the capacitance value of one or both variable capacitive devices includes adjusting the capacitance value of one or both of variable capacitive devices Ca or Cb, as discussed above with respect to FIGS. 1A-4.

In some embodiments, adjusting the capacitance value of one or both variable capacitive devices includes changing a number of capacitive devices arranged in parallel, e.g., changing the number of capacitive devices C3-C6 of variable capacitive device 400 arranged in parallel, as discussed above with respect to FIG. 4.

By executing some or all of the operations of method 500, a circuit generates an output voltage having adjustable values based on input and reference voltages and values of variable capacitance devices, thereby achieving the benefits discussed above with respect to circuits 100, 100S, 200, and 200S.

In some embodiments, a circuit includes a first capacitive device coupled between first and second nodes, a second capacitive device coupled between third and fourth nodes, a first switching device coupled between the first node and a voltage node, a second switching device coupled between the second node and a reference voltage node, a third switching device coupled between the third node and the voltage node, a fourth switching device coupled between the fourth node and the reference voltage node, fifth through eighth switching devices coupled between the respective first through fourth nodes and an output node, and first and second variable capacitance devices including first terminals coupled to either the respective first and third nodes or the respective second and fourth nodes. In some embodiments, the first terminals of the first and second variable capacitance devices are coupled to the respective second and fourth nodes, and each of the first and second variable capacitance devices includes a second terminal coupled to the output node. In some embodiments, the first terminals of the first and second variable capacitance devices are coupled to the respective first and third nodes, and each of the first and second variable capacitance devices includes a second terminal coupled to the output node. In some embodiments, each of the first and second variable capacitance devices includes a second terminal coupled to the reference voltage node. In some embodiments, the first, fourth, sixth, and seventh switching devices are configured to be switched on and off alternatively with the second, third, fifth, and eighth switching devices. In some embodiments, a duty cycle of the first, fourth, sixth, and seventh switching devices being switched on and off alternatively with the second, third, fifth, and eighth switching devices is approximately fifty percent. In some embodiments, the first and second capacitive devices are configured to have a same capacitance value. In some embodiments, the first and second variable capacitance devices are configured to have same variable capacitance values. In some embodiments, each of the first and second variable capacitance devices includes a parallel arrangement of capacitive devices in series with switching devices. In some embodiments, the circuit includes a third capacitive device coupled between the output node and the reference voltage node.

In some embodiments, a circuit includes a first capacitive device coupled between first and second nodes, a second capacitive device coupled between third and fourth nodes, a first switching device coupled between the first node and a voltage node, a second switching device coupled between the second node and a reference voltage node, a third switching device coupled between the third node and the voltage node, a fourth switching device coupled between the fourth node and the reference voltage node, fifth through eighth switching devices coupled between the respective first through fourth nodes and an output node, and first and second variable capacitance devices coupled between the output node and either the respective first and third nodes or the respective second and fourth nodes. In some embodiments, the first through eighth switching devices are configured to alternatively couple the output node to the reference node through a first parallel arrangement of the first capacitive device and the first variable capacitance device or a second parallel arrangement of the second capacitive device and the second variable capacitance device. In some embodiments, the first through eighth switching devices are configured to alternatively couple the output node to the voltage node through a first parallel arrangement of the first capacitive device and the first variable capacitance device or a second parallel arrangement of the second capacitive device and the second variable capacitance device. In some embodiments, the first and second capacitive devices are configured to have a same capacitance value, the first and second variable capacitance devices are configured to have same variable capacitance values, and the same capacitance value and the same variable capacitance values have a same order of magnitude. In some embodiments, the circuit includes a third capacitive device coupled between the output node and the reference voltage node, wherein the third capacitance device has a capacitance value at least one order of magnitude greater than capacitance values of the first and second capacitive devices and first and second variable capacitance devices.

In some embodiments, a method of operating a circuit includes receiving an input voltage at a voltage node of the circuit, the circuit including a first capacitive device coupled between first and second nodes, a second capacitive device coupled between third and fourth nodes, a first switching device coupled between the first node and the voltage node, a second switching device coupled between the second node and a reference voltage node, a third switching device coupled between the third node and the voltage node, a fourth switching device coupled between the fourth node and the reference voltage node, fifth through eighth switching devices coupled between the respective first through fourth nodes and an output node, and first and second variable capacitance devices including first terminals coupled to either the respective first and third nodes or the respective second and fourth nodes, and alternatively switching the first, fourth, sixth, and seventh switching devices with the second, third, fifth, and eighth switching devices, thereby generating an output voltage on the output node. In some embodiments, alternatively switching the first, fourth, sixth, and seventh switching devices with the second, third, fifth, and eighth switching devices includes alternatively coupling the output node to the reference node through a first parallel arrangement of the first capacitive device and the first variable capacitance device or a second parallel arrangement of the second capacitive device and the second variable capacitance device. In some embodiments, the alternatively switching the first, fourth, sixth, and seventh switching devices with the second, third, fifth, and eighth switching devices includes alternatively coupling the output node to the voltage node through a first parallel arrangement of the first capacitive device and the first variable capacitance device or a second parallel arrangement of the second capacitive device and the second variable capacitance device. In some embodiments, the method includes measuring the output voltage and adjusting a capacitance value of each of the variable capacitance devices in response to the measured output voltage. In some embodiments, adjusting the capacitance value of each of the variable capacitance devices includes changing a number of capacitive devices arranged in parallel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:

a first capacitive device coupled between first and second nodes;

a second capacitive device coupled between third and fourth nodes;

a first switching device coupled between the first node and a voltage node;

a second switching device coupled between the second node and a reference voltage node;

a third switching device coupled between the third node and the voltage node;

a fourth switching device coupled between the fourth node and the reference voltage node;

fifth through eighth switching devices coupled between the respective first through fourth nodes and an output node; and first and second variable capacitance devices comprising first terminals directly connected to either the respective first and third nodes or the respective second and fourth nodes.

2. The circuit of claim 1, wherein the first terminals of the first and second variable capacitance devices are directly connected to the respective second and fourth nodes, and each of the first and second variable capacitance devices comprises a second terminal coupled to the output node.

3. The circuit of claim 1, wherein the first terminals of the first and second variable capacitance devices are directly connected to the respective first and third nodes, and each of the first and second variable capacitance devices comprises a second terminal coupled to the output node.

4. The circuit of claim 1, wherein each of the first and second variable capacitance devices comprises a second terminal coupled to the reference voltage node.

5. The circuit of claim 1, wherein the first, fourth, sixth, and seventh switching devices are configured to be switched on and off alternatively with the second, third, fifth, and eighth switching devices.

6. The circuit of claim 5, wherein a duty cycle of the first, fourth, sixth, and seventh switching devices being switched on and off alternatively with the second, third, fifth, and eighth switching devices is approximately fifty percent.

7. The circuit of claim 1, wherein the first and second capacitive devices are configured to have a same capacitance value.

8. The circuit of claim 1, wherein the first and second variable capacitance devices are configured to have same variable capacitance values.

9. The circuit of claim 1, wherein each of the first and second variable capacitance devices comprises a parallel arrangement of capacitive devices in series with switching devices.

10. The circuit of claim 1, further comprising:

a third capacitive device coupled between the output node and the reference voltage node.

11. A circuit comprising:

a first capacitive device coupled between first and second nodes;

a second capacitive device coupled between third and fourth nodes;

a first switching device coupled between the first node and a voltage node;

a second switching device coupled between the second node and a reference voltage node;

a third switching device coupled between the third node and the voltage node;

a fourth switching device coupled between the fourth node and the reference voltage node;

fifth through eighth switching devices coupled between the respective first through fourth nodes and an output node; and first and second variable capacitance devices coupled between the output node and either the respective first and third nodes or the respective second and fourth nodes.

12. The circuit of claim 11, wherein the first through eighth switching devices are configured to alternatively couple the output node to the reference node through:

a first parallel arrangement of the first capacitive device and the first variable capacitance device, or a second parallel arrangement of the second capacitive device and the second variable capacitance device.

13. The circuit of claim 11, wherein the first through eighth switching devices are configured to alternatively couple the output node to the voltage node through:

a first parallel arrangement of the first capacitive device and the first variable capacitance device, or a second parallel arrangement of the second capacitive device and the second variable capacitance device.

14. The circuit of claim 11, wherein the first and second capacitive devices are configured to have a same capacitance value, the first and second variable capacitance devices are configured to have same variable capacitance values, and the same capacitance value and the same variable capacitance values have a same order of magnitude.

15. The circuit of claim 11, further comprising:

a third capacitive device coupled between the output node and the reference voltage node, wherein the third capacitance device has a capacitance value at least one order of magnitude greater than capacitance values of the first and second capacitive devices and first and second variable capacitance devices.

16. A method of operating a circuit, the method comprising:

receiving an input voltage at a voltage node of the circuit, the circuit further comprising:

a first capacitive device coupled between first and second nodes;

a second capacitive device coupled between third and fourth nodes;

a first switching device coupled between the first node and the voltage node;

a second switching device coupled between the second node and a reference voltage node;

a third switching device coupled between the third node and the voltage node;

a fourth switching device coupled between the fourth node and the reference voltage node;

fifth through eighth switching devices coupled between the respective first through fourth nodes and an output node; and first and second variable capacitance devices comprising first terminals coupled to either the respective first and third nodes or the respective second and fourth nodes; and alternatively switching the first, fourth, sixth, and seventh switching devices with the second, third, fifth, and eighth switching devices, thereby generating an output voltage on the output node.

17. The method of claim 16, wherein the alternatively switching the first, fourth, sixth, and seventh switching devices with the second, third, fifth, and eighth switching devices comprises alternatively coupling the output node to the reference node through:

a first parallel arrangement of the first capacitive device and the first variable capacitance device, or a second parallel arrangement of the second capacitive device and the second variable capacitance device.

18. The method of claim 16, wherein the alternatively switching the first, fourth, sixth, and seventh switching devices with the second, third, fifth, and eighth switching devices comprises alternatively coupling the output node to the voltage node through:

a first parallel arrangement of the first capacitive device and the first variable capacitance device, or a second parallel arrangement of the second capacitive device and the second variable capacitance device.

19. The method of claim 16, further comprising:

measuring the output voltage; and adjusting a capacitance value of each of the variable capacitance devices in response to the measured output voltage.

20. The method of claim 19, wherein the adjusting the capacitance value of each of the variable capacitance devices comprises changing a number of capacitive devices arranged in parallel.

* * * * *